(12) United States Patent
Young

(10) Patent No.: US 9,237,042 B2
(45) Date of Patent: Jan. 12, 2016

(54) FILTER NETWORK ARRANGEMENT

(71) Applicant: ASTRIUM LIMITED, Stevenage, Hertfordshire (GB)

(72) Inventor: David Young, Stevenage (GB)

(73) Assignee: Astrium Ltd., Hertfordshire (GB)

( * ) Notice: Subject to any disclaimer, the term of this patent is extended or adjusted under 35 U.S.C. 154(b) by 0 days.

(21) Appl. No.: 14/399,810

(22) PCT Filed: May 3, 2013

(86) PCT No.: PCT/EP2013/059311
§ 371 (c)(1),
(2) Date: Nov. 7, 2014

(87) PCT Pub. No.: WO2013/167498
PCT Pub. Date: Nov. 14, 2013

(65) Prior Publication Data
US 2015/0124857 A1    May 7, 2015

(30) Foreign Application Priority Data
May 9, 2012    (EP) .................................... 12275064

(51) Int. Cl.
*H04B 3/36*  (2006.01)
*H04L 25/03*  (2006.01)
*H03H 21/00*  (2006.01)
*H04B 7/185*  (2006.01)

(52) U.S. Cl.
CPC ...... *H04L 25/03159* (2013.01); *H03H 21/0001* (2013.01); *H04B 7/18513* (2013.01); *H04L 25/03878* (2013.01); *H04L 2025/03375* (2013.01)

(58) Field of Classification Search
CPC ................................................ H04L 25/03159
USPC ........................................................ 375/211
See application file for complete search history.

(56) References Cited

FOREIGN PATENT DOCUMENTS

WO    WO-2010/097349 A2    9/2010

OTHER PUBLICATIONS

International Search Report of PCT/EP2013/059311 dated Aug. 28, 2013.
Written Opinion of the International Searching Authority of PCT/EP2013/059311 dated Aug. 28, 2013.

*Primary Examiner* — Lihong Yu
(74) *Attorney, Agent, or Firm* — Venable LLP; Robert Kinberg

(57) ABSTRACT

There is provided a filter network arrangement comprising a filter network; and one or more correction networks, wherein the one or more correction networks is arranged to substantially equalize the passband gain and group delay of the filter network arrangement. Given an appropriate Q for the one or more correction networks, a polynomial for the one or more correction networks can be found that equalizes both the passband gain and group delay and the one or more correction networks can be synthesized from the polynomial.

11 Claims, 6 Drawing Sheets

Fig. 6a
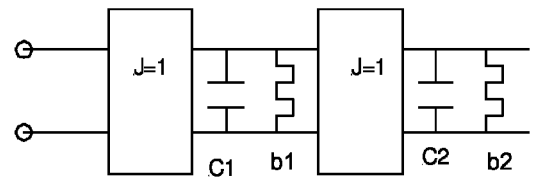
Fig. 6b
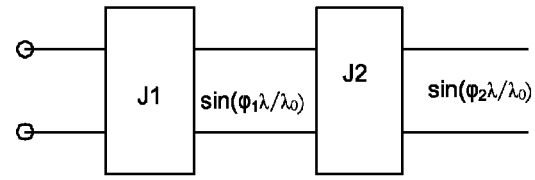
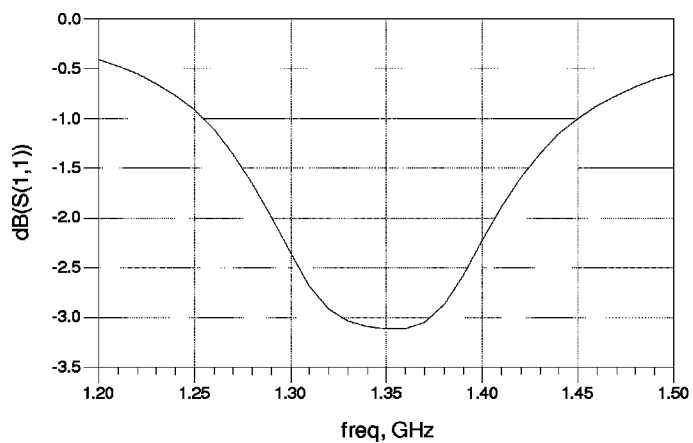
Fig. 7a

FILTER NETWORK ARRANGEMENT

FIELD OF THE INVENTION

The invention relates to filtering of signals. In particular, the invention relates to the equalising of attenuation and group delay across the passband of a filter network arrangement.

BACKGROUND OF THE INVENTION

Communication satellites typically process signals received and transmitted in a number of communication channels. To separate and combine the communication channels, the satellite may make use of a number of filters. Filters involved in signal processing are designed to meet often strict requirements on signal quality. Gain and group delay variation as a function of frequency can cause signal degradation. It is therefore desirable that filters involved in signal processing exhibit close to gain flatness and group delay flatness where possible.

In non-minimum phase filters, cross-couplings within the filters have been used to equalise the group delay of the filters. This technique requires a higher order filter and there is a limit to the percentage of the bandwidth of the filter which can be corrected.

It is also known to use external networks to equalise group delay across the passband of a filter. For example, external one-port networks have been used to add appropriate delays to signals in the passband.

Moreover, it is known that the quality factor (Q) of the resonators of a filter can be adjusted in order to give some flattening of the passband. The Q of a resonator is a measure of the strength of the damping of its oscillations. To obtain a flat passband, very high Q filter resonators are conventionally used, which results in a filter with a relatively large size. To obtain a flat passband with lower Q resonators, pre-distortion, the introduction of complex transmission zeros or lossy cross couplings in the filter have been suggested. The use of complex zeros or lossy cross couplings to flatten the passband means that an increase in the complexity and the order of the filter is required.

The invention aims to improve on the prior art.

SUMMARY OF THE INVENTION

According to the invention, there is provided a filter network arrangement comprising a filter network; and one or more correction networks, wherein the one or more correction networks is configured to substantially equalise the passband gain and group delay of the filter network arrangement.

It will be realised that the passband gain and group delay of the filter network arrangement will not be perfectly flat across the whole passband. However, the one or more external correction networks are arranged to reduce the variation in gain and group delay across the passband. The correction network is designed to have a gain and group delay that equalise the overall gain and the group delay to provide an approximately flat overall passband group delay and gain. By group delay, it is meant the derivative of the phase with respect to angular frequency.

The Qs of the filter network and the one or more correction network may be selected such that $$0.4 \leq \frac{r_c}{r_f} \leq 2.5,$$

where $$r_c = \frac{f_0}{bw} \frac{1}{Q_c} \text{ and } r_f = \frac{f_0}{bw} \frac{1}{Q_f},$$

$Q_c$ is the Q of the one or more correction networks, $Q_f$ is the Q of the filter network and $f_o$ and bw are the centre frequency and the bandwidth of the filter network respectively. It has been found that if the Qs comply with the above relationship, the group delay across the passband of the filter network arrangement is substantially uniform when the gain across the passband is uniform and a polynomial can be constructed for the one or more correction networks that equalises both the gain and the group delay across the passband of the filter network arrangement.

The Qs may be selected such that $r_c$ is greater than $r_f$ in order to achieve flattening of the passband for a greater percentage of the filter bandwidth for a given order of the one or more correction networks.

Alternatively, the Q of the or each of the one or more correction networks can be chosen to be the same or substantially the same as the Q of the filter network. The filter network and the one or more correction network may be realised in the same or similar medium to ensure that the Q of the one or more correction networks is the same as the Q of the filter network.

It has been found that if the one or more external correction networks has substantially the same Q as the filter network, there exist solutions for the one or more correction networks which will flatten the filter passband and also equalise the group delay of the filter network arrangement irrespective of the actual Q. Consequently, the precise Q of the filter network does not need to be known as long as the one or more correction network has substantially the same Q as the filter network, for example if the resonators of the one or more correction networks are of the same type and realised in the same or similar medium as the filter network. In other words, if the Q of the filter and the at least one correction network are the same a solution for the at least one correction network which flattens gain will also flatten group delay. The relationship is not exact so flattening of the gain will not give precise flattening of the group delay. A solution for the one or more correction networks may be selected which gives the best gain flatness, thereby providing a substantially flat group delay as well. In other words, a correction network that minimises the variation in gain of the filter network arrangement can be chosen and, as a consequence, the group delay variation would also be reduced.

The invention allows a filter network with low Q resonators to be used and the size of the filter network can be reduced compared to filter networks that use high Q resonators to flatten the passband. Since an external network is added, the overall size of the filter network arrangement could of course be double the size of the filter network. However, the overall size would still be smaller or comparable to the filter network in which the passband of the filter was flattened by increasing the Q and, according to the invention, the group delay would also be equalised.

The one or more correction networks may comprise one or more one-port networks and the filter network may comprise means for connecting the one or more one-port networks to the filter. At least one one-port correction network may be required depending on the arrangement of the circuit. In more detail, the means for connecting the one or more correction networks to the filter network may comprise a coupler or a circulator. If the connection means is a coupler, two one-port correction networks would be required.

The order of the or each of the one or more correction network may be the same or lower than the order of the filter network to minimise the size of the network arrangement. Alternatively, the order of the correction network may be greater that the order of the filter network.

The one or more correction networks may be synthesised from a polynomial H(s), the coefficients of which may be determined through optimising an error function for the gain and the group delay of the filter network arrangement. The roots of the polynomial may be optimised by minimising the error function for the gain on its own. The symmetry of the poles and zeros in the complex plane may be maintained about the line $s=r_c$.

The filter network arrangement may be a low temperature co-fired ceramic filter network arrangement. The filter network arrangement may be a multi-layer filter network arrangement.

Alternatively, the filter network arrangement could be implemented as a microstrip.

According to the invention, there is also provided a processing arrangement for a communication satellite comprising a filter network arrangement as set out above.

Furthermore, according to the invention, there is provided a method of obtaining a filter network arrangement comprising a filter network and one or more correction networks for equalising the gain and the group delay across the passband of the filter network arrangement, the method comprising: determining a polynomial and a Q for a filter network; choosing a Q for the one or more correction networks; selecting a starting polynomial for the one or more correction networks and adjusting the coefficients of the polynomial to substantially equalise gain and group delay across the passband of the filter network; and synthesising the filter network and the one or more correction networks from the polynomial for the filter network and the polynomial for the one or more correction networks.

The Q of the one or more correction networks may be selected based on the Q of the filter network. The Qs of the filter network and the one or more correction networks may be selected such that $$0.4 \leq \frac{r_c}{r_f} \leq 2.5,$$

where $$r_c = \frac{f_0}{bw}\frac{1}{Q_c} \text{ and } r_f = \frac{f_0}{bw}\frac{1}{Q_f},$$

$Q_c$ is the Q of the one or more correction networks, $Q_f$ is the Q of the filter network and $f_o$ and bw are the centre frequency and the bandwidth of the filter network respectively.

Adjusting the coefficients of the polynomial may comprise adjusting the coefficients of the polynomial in dependence of the Qs of the filter network and the correction networks. Determining the coefficients of the polynomial may comprise minimising the error function $$E(\sigma_k,\omega_k)=\phi E_1(\sigma_k,\omega_k)+\gamma E_2(\sigma_k,\omega_k),$$

where $\phi, \gamma$ are weighting constants, $$E_1(\omega,\sigma_k,\omega_k)=||S11_l(\omega,\sigma_k,\omega_k)|^2 \cdot |S21_l(\omega)|^2 - \max(|S11_l(\omega,\sigma_k,\omega_k)|^2 \cdot |S21_l(\Omega)|^2)|$$

where $$|S11_l(\omega, \sigma_k, \omega_k)|^2 \cdot |S21_l(\omega)|^2 = \frac{\prod_{k=1}^{K}((\sigma_k + r_c)^2 + (\omega - \omega_k)^2)\prod_{m=1}^{M}((\sigma_m - r_f)^2 + (\omega - \omega_m)^2)}{\prod_{k=1}^{K}((\sigma_k - r_c)^2 + (\omega - \omega_k)^2)\prod_{p=1}^{P}((\sigma_p - r_f)^2 + (\omega - \omega_p)^2)}$$

and $$E_2(\sigma_k, \omega_k) = 2 \cdot \sum_{k=1}^{K} \frac{(\sigma_k - r_c) \cdot (\omega - \omega_k)}{((\sigma_k - r_c)^2 + (\omega - \omega_k)^2)^2} + \sum_{p=1}^{P} \frac{(\sigma_p - r_f) \cdot (\omega - \omega_p)}{((\sigma_p - r_f)^2 + (\omega - \omega_p)^2)^2} - \sum_{q=1}^{Q} \frac{(\sigma_q - r_f) \cdot (\omega - \omega_q)}{((\sigma_q - r_f)^2 + (\omega - \omega_q)^2)^2}$$

where $\sigma_k+i\omega_k$ are the roots of the polynomial for the correction network,
$\sigma_m+i\omega_m$ are the roots of the numerator polynomial for the filter network and
$\sigma_p+i\omega_p$ are the roots of the denominator polynomial for the filter network.

When the Qs of the filter network and the one or more correction networks are the same, the precise values of $r_c$ and $r_f$ may be not required for the determination of the coefficients of the polynomial and only an estimate may be used.

Minimising the error function may comprise first minimising $E(\sigma_k,\omega_k)$ to find approximate coefficients for the correction network polynomial and then minimising $E_1$ on its own to optimise the roots of the correction network polynomial.

Finding the coefficients of the polynomial H(s) may comprise finding coefficients that minimise said error functions while still maintaining the symmetry of the correction network polynomial about the line $s=r_c$.

BRIEF DESCRIPTION OF THE DRAWINGS

Embodiments of the invention will now be described, by way of example, with reference to FIGS. 1 to 10 of the accompanying drawings, in which:

FIGS. 6*a* and 6*b* illustrate a prototype correction network and an example of a correction network at a later stage in the correction network synthesis process;

FIGS. 7a and 7b illustrate the loss and the group delay respectively of one example of a correction network;

DETAILED DESCRIPTION

Figure 1:
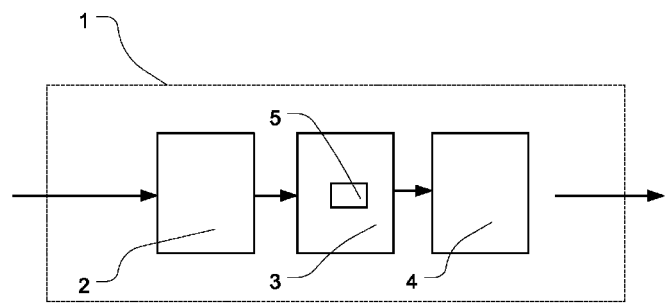
FIG. 1 is a schematic block diagram of a system in which a filter network arrangement is used.

With reference to FIG. 1, a high-level diagram of a communication system 1 is shown comprising receiver 2 for receiving signals, a signal processing arrangement 3 for processing signals and a transmitter 4 for transmitting signals. The system may be a satellite communication system. The processing arrangement 3 may comprise one or more filter network arrangements 5. The filter network arrangement may, for example, comprise a bandpass filter network and may, for example, be used in a demultiplexer for demultiplexing received signals into a number of frequency channels. Alternatively, the filter network arrangements may be used in an up- or down-converter. It should be realised that a filter network arrangement could alternatively be used for any other suitable purpose.

The filter network arrangement is configured to let through signals of a specific frequency range and stop signals with frequencies outside the frequency range. The filter network arrangement will have some effect on the amplitude and the phase of the signals passed. For example, the loss of a real filter causes rounding of the passband amplitude and the amplitude selectivity of the filter causes a varying group delay.

Group delay is a measure of how long it takes for a signal of a particular frequency to traverse a network. The group delay is conventionally considered the derivative of the phase response of the network with respect to the angular frequency, $$\frac{\partial \phi}{\partial \omega},$$

and, accordingly, the derivative of the phase response with respect to angular frequency will hereinafter be referred to as the "group delay".

Figure 2:
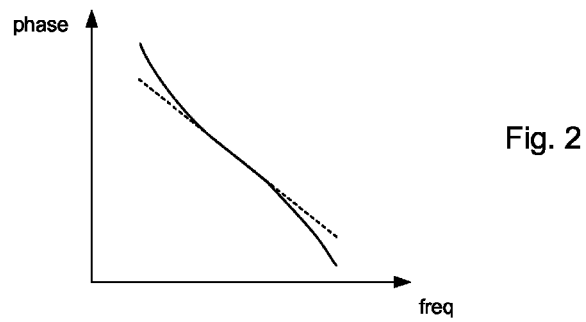
FIG. 2 illustrates the phase variation with frequency of a real and an ideal filter network.

The dashed line of FIG. 2 shows the relationship between the phase and the frequency for an ideal filter and the solid line of FIG. 2 shows the relationship between the phase and the frequency for a real filter. As indicated by the dashed line, there is a linear relationship between the phase and the frequency for all signals that pass through an ideal filter network. In other words, the group delay for the passband of the filter network is the same irrespective of the frequency of the signal. However, a real filter will not have a constant group delay. Instead, the signals at the edges of the filter bandwidth will undergo a larger phase adjustment in a real filter than in an ideal filter, as indicated by the solid line of FIG. 2.

Figure 3:
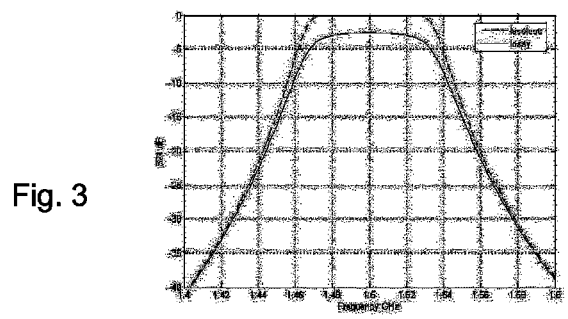
FIG. 3 illustrates the gain variation with frequency of a lossy and a lossless filter network.

The dashed line of FIG. 3 shows the amplitude response of a lossless filter and the solid line of FIG. 3 shows the amplitude response of a lossy filter. For equi-ripple filter functions, an $n^{th}$ order lossless filter will have n frequency points of perfect transmission, between which a small amount of power will be reflected. As shown in FIG. 3, a lossy filter attenuates the amplitude significantly more than a lossless filter. The solid line of FIG. 3 also shows rounding of the passbands for the lossy filter, caused by the finite quality factor (Q) of the filter. Loss is generally not a problem as long as it is uniform. Ideally, the gain across the passband should be constant.

A filter network arrangement according to embodiments of the invention exhibits approximately uniform attenuation of signals across the frequencies in the passband. It will be shown that the filter network arrangement according to the invention will also have a flattened group delay. In reality, the gain and the group delay will not be exactly flat. An approximation to flatness in the form of a ripple function is considered acceptable. The key is that the gain and the group delay will be significantly flatter for the overall filter network arrangement than for the filter network on its own. In other words, the correction network improves the gain and group delay characteristics compared to the filter network on its own.

Figure 4:
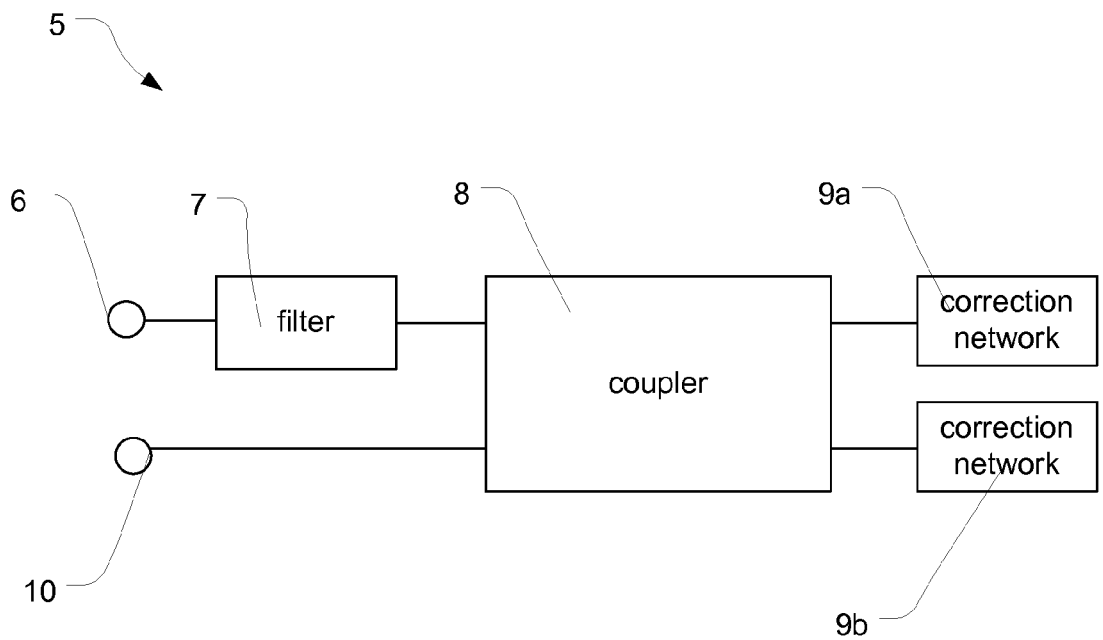
FIG. 4 is a schematic diagram of a filter network arrangement according to a first embodiment of the invention.

With reference to FIG. 4, one embodiment of a filter network arrangement according to the invention is shown. The filter network arrangement 5 comprises a first port 6, a filter network 7, a coupler 8, two correction networks 9a, 9b and a second port 10. The correction networks 9a, 9b are provided to correct for the varying loss of the filter network 7 across the passband such that the signals passing through the filter network arrangement 5 are attenuated to approximately the same extent across the whole bandwidth of the filter. The correction networks also equalise the group delay. The two correction networks would effectively be identical.

The filter network 7 of the filter network arrangement 5 may be a microwave filter. For example, it could be a combline filter, interdigital filter or a waveguide filter. However, it will be realised that the filter network 7 is not limited to a microwave filter and it could be any frequency filter. The filter network 7 could be implemented in ceramics. For example, it may be a low temperature co-fired (LTCC) ceramic filter. The coupler shown in FIG. 4 is a 3 dB coupler. According to some embodiments of the invention, the two correction networks 9a, 9b are both one-port correction networks. In the example of FIG. 4, a signal would be subject to the correction network whether it is passed from the first 6 to the second port 10 or the second port 10 to the first port 6.

According to some embodiments of the invention, given the transfer function of the filter network 7, an appropriate correction network may be implemented by determining a correction network polynomial that will flatten the passband and synthesising the correction network from the polynomial. It is realised that if the correction network equalises the gain of the overall filter network arrangement it will also flatten the group delay, provided the Q of the correction network is close to the Q of the filter network 7. It is recognised, according to the invention, that the set of polynomials H(s) that give approximately flat group delay in the desired range includes polynomials that also flatten the gain. It is realised that as long as the correction network and the filter network have similar Qs, by selecting a polynomial that flattens the gain of the passband the group delay is also flattened. However, if the Qs are different, an appropriate correction network polynomial can still be found that substantially equalises both the gain and the group delay of the filter network arrangement. In other words, a correction network can be synthesised that simultaneously corrects both the group delay and the gain of the filter network arrangement. As will be described in more detail below, in the design of the filter network arrangement, the focus is on flattening the gain and the flattening of the group delay then follows.

It will now be shown mathematically that the group delay is equalised when the gain across the passband is equalised, provided that the respective Qs of the filter network and correction network have suitable values. It will then be shown how the relationship between the group delay and the loss can be used to design the correction network. Scattering parameters, also referred to as S-parameters, will be used to describe the electrical behaviour of the network. In the discussion below, the filter and correction network are described in the lowpass domain. The units of angular frequency $\omega$ are in radians/seconds, the units of the group delay are in seconds and the units of the gain are in decibles.

$S_{11}$ of a lossless correction network can be written as $$S11 = \frac{\overline{H(-s)}}{H(s)} = \frac{\prod_{k=1}^{K}(\sigma_k + i(\omega - \omega_k))}{\prod_{k=1}^{K}(-\sigma_k + i(\omega - \omega_k))} \quad (1)$$

where H(s) is a Hurwitz stable polynomial representing the transfer function of the correction network, $\omega$ is angular frequency, $\sigma_k + I\omega_k$ are the roots of H(s) and H(s) have K roots.

For a lossless purely reactive one-port network, there is symmetry of the poles and zeros of $S_{11}$ around $\omega=0$ and the gain of the correction network can be written as $$|S11|^2 = \overline{S11}S11 = \frac{\prod_{k=1}^{K}(\sigma_k^2 + (\omega - \omega_k)^2)}{\prod_{k=1}^{K}(\sigma_k^2 + (\omega - \omega_k)^2)} = 1 \quad (2)$$

where $\overline{S_{11}}$ is the complex conjugate of S11.

If we add some loss to the correction network we break the unity condition and $$\overline{S11}S11 = \frac{\prod_{k=1}^{K}((\sigma_k + r_c)^2 + (\omega - \omega_k)^2)}{\prod_{k=1}^{K}((\sigma_k - r_c)^2 + (\omega - \omega_k)^2)} = f(s) \quad (3)$$

where f(s)<1. According to embodiments of the invention, f(s) of the correction network is controlled in order to compensate for the rounding of the passband of the filter network due to loss in the filter network. In words, additional loss is added to flatten the gain across the passband. Loss in a filter is generally not a problem as long as it is uniform. The filter network arrangement would typically be provided next to a low noise amplifier (LNA) and the extra loss in the filter network arrangement could be compensated for by increasing the LNA gain.

Mathematically, adding loss corresponds to shifting the poles and zeros of the polynomial representing the transfer function to the left in the complex plane. Put a different way, making a network lossy is equivalent to adding a negative real part to the roots of the network polynomials. The poles and zeros are shifted to the left in the complex plane by shifting the real part $\sigma_k$ by a constant amount $r_c$, where $r_c$ is related to the $Q_c$ of the resonators used in the final realisation of the correction network as shown below:

$$r_c = \frac{f_0}{bw} \frac{1}{Q_c} \quad (4)$$

where $f_o$ is the centre frequency and bw the bandwidth of the correction network. The bandwidth of the correction network is the same as the bandwidth of the filter network. The symmetry of $S_{11}$ is maintained for a lossy network but the line of symmetry is shifted to $s=r_c$.

The group delay of a correction network can be written as $$gd_c = 2\sum_{k=1}^{K} \frac{\sigma_k}{(\sigma_k^2 + (\omega - \omega_k)^2)} \quad (5)$$

The Taylor series for the group delay and the insertion loss with respect to $-\sigma$ (the real part of s) can be examined to see the effect of adding loss to lossless networks. As will be shown below, a relationship between the group delay and the insertion loss which is considered when designing the filter network arrangement according to the invention can then be found.

The Taylor expansion of the group delay is $$gd_{c_l} = gd_c + \nabla_c \cdot r_c + O(r_c^2) \quad (6)$$

where $\nabla_c$ is the gradient of the group delay with respect to $-\sigma$ (the real part of s), and $gd_{c_l}$ is the group delay of the lossy correction network. Due to the symmetry of the poles and zeros of $S_{11}$ of the lossless, purely reactive correction network, $\nabla_c = 0$ and thus $$gd_{c_l} \approx gd_c, \quad (7)$$

provided that the higher order terms in the Taylor expansion are small.

Consequently, it can be seen from Equations 6 and 7 that the group delay of the correction network is affected very little by the addition of a small amount of loss. Some of the higher order terms in the Taylor series are non-zero and so $gd_{c_l}$ is not exactly equal to $gd_c$.

The Taylor expansion of the gain of Equation 2 gives $$|S11_l|^2 = \quad (8)$$

$$\overline{S11}_l S11_l = \overline{S11}S11 + \nabla(\overline{S11}S11) \cdot r_c + \frac{1}{2}\nabla^2(\overline{S11}S11) \cdot r_c^2 + O(r_c^3)$$

where $S11_l$ is S11 of the lossy network and $\nabla(\overline{S11}S11)$ is the gradient of $\overline{S11}S11$ with respect to $-\sigma$ and $\nabla^2(\overline{S11}S11)$ is the gradient of $\nabla(\overline{S11}S11)$ with respect to $-\sigma$, etc. It can be found that $$\nabla(\overline{S11}S11) = -4\left(\sum_{k=1}^{K} \frac{\sigma_k}{(\sigma_k^2 + (\omega - \omega_k)^2)}\right) \cdot \overline{S11}S11,$$

which can be written as $\nabla(\overline{S11}S11) = -2 \cdot \overline{S11}S11 \cdot gd_c$. It can further be found that $\nabla^2(\overline{S11}S11) = 4\overline{S11}S11 \cdot gd_c^2 + 2\overline{S11}S11 \cdot \nabla_c$. Considering that $\nabla_c = 0$, it can be seen that $$\overline{S11}_l S11_l = \overline{S11}S11\left(1 - 2 \cdot gd_c r_c + \frac{(2 \cdot gd_c \cdot r_c)^2}{2!} - \frac{(2 \cdot gd_c \cdot r_c)^3}{3!} + \ldots\right).$$

Since $\overline{S11}S11=1$, it follows that $$\overline{S11}_l S11_l = 1 + \sum_{m=1}^{\infty} \frac{(-1)^m}{m!}(2 \cdot gd_c \cdot r_c)^m,$$

that is $$|S11_l|^2 = \exp(-2gd_c \cdot r_c) \quad (9)$$

Equation 9 shows that the loss of the correction network is a function of its group delay.

A similar analysis can be carried out for a filter network. S21 for a lossless filter network can be written as $$S21 = \frac{\prod_{m=1}^{M}(-\sigma_m + i(\omega - \omega_m))}{\prod_{p=1}^{P}(-\sigma_p + i(\omega - \omega_p))} \quad (10)$$

where $\omega$ is angular frequency, $\sigma_m + I\omega_m$ are the roots of the numerator polynomial and $\sigma_p + i\omega_p$ are the roots of the denominator polynomial for the filter network. The numerator polynomial has M roots and the denominator polynomial has P roots.

Consequently, the gain of the filter network can be written as $$|S21|^2 = \overline{S21}S21 \quad (11)$$

$$= \frac{\prod_{m=1}^{M}(\sigma_m^2 + (\omega - \omega_m)^2)}{\prod_{p=1}^{P}(\sigma_p^2 + (\omega - \omega_p)^2)}$$

and the group delay of the filter network can be written as $$gd_f = \sum_{p=1}^{P} \frac{\sigma_p}{(\sigma_p^2 + (\omega - \omega_p)^2)} - \sum_{m=1}^{M} \frac{\sigma_m}{(\sigma_m^2 + (\omega - \omega_m)^2)} \quad (12)$$

To take into account the loss and therefore the finite Q of the filter resonators ($Q_f$), the poles and zeros of the filter transfer function must be shifted to the left in the complex plane by a constant amount $r_f$, where $r_f$ is related to $Q_f$ by $$r_f = \frac{f_0}{bw} \frac{1}{Q_f} \quad (13)$$

where $f_o$ is the centre frequency and bw the bandwidth of the filter network 7.

As before, the Taylor series for the group delay and the insertion loss with respect to $-\sigma$ (the real part) can be examined to see the effect of adding loss to the lossless filter networks. The Taylor series expansion of the group delay becomes $$gd_{f_l} = gd_f + \nabla gd_f \cdot r_f + \frac{1}{2}\nabla^2 gd_f \cdot r_f^2 + O(r_f^3) \quad (14)$$

where $\nabla_f$ is the gradient of the group delay with respect to $-\sigma$, and $gd_{f_l}$ is the group delay of the lossy filter network. For the filter network, there is no symmetry for the poles and zeros and so $\nabla_f \neq 0$.

If Equation 14 is expanded, it becomes $$gd_{f_l} = gd_f + \sum_{p=1}^{P} \frac{-\sigma_p^2 + (\omega - \omega_p)^2}{(\sigma_p^2 + (\omega - \omega_p)^2)^2} \cdot r_f - \quad (15)$$

$$\sum_{m=1}^{M} \frac{-\sigma_m^2 + (\omega - \omega_m)^2}{(\sigma_m^2 + (\omega - \omega_m)^2)^2} \cdot r_f + O(r_f^2).$$

For a small change $r_f$ in $\sigma_p$ and $\sigma_m$, the gain of the filter network becomes $$\overline{S21}_l S21_l = \overline{S21}S21 + \nabla(\overline{S21}S21) \cdot r_f + \frac{1}{2}\nabla^2(\overline{S21}S21) \cdot r_f^2 + O(r_f^3) \quad (16)$$

where $S21_l$ is S21 of the lossy filter network and $\nabla(\overline{S21}S21)$ is the gradient of $\overline{S21}S21$ with respect to $-\sigma$. Now $\nabla(\overline{S21}S21) = -2 \cdot gd_f \cdot \overline{S21}S21$ and thus $$\overline{S21}_l S21_l = \overline{S21}S21 - 2 \cdot (\overline{S21}S21 \cdot gd_f) \cdot r_f - \quad (17)$$

$$\frac{2}{2!}\nabla(\overline{S21}S21 \cdot gd_f) \cdot r_f^2 - \frac{2}{3!}\nabla^2(\overline{S21}S21 \cdot gd_f) \cdot r_f^3$$

where $\nabla(\overline{S21}S21 \cdot g_f)$ is the gradient of $\overline{S21}S21 \cdot gd_f$ with respect to $-\sigma$, etc.

This time, since $\nabla dg_f \neq 0$, there will be terms $\nabla dg_f$, $\nabla^2 dg_f$ etc. However, by expanding Equation 17 it can be seen that the dominant terms can be written $$as \frac{(-1)^m}{m!}\overline{S21}S21 \cdot 2^m \cdot gd_f^m \cdot r_f^n.$$

Hence, it can be found that $$\overline{S21}_l S21_l \approx \overline{S21}S21\left(1 + \sum_{m=1}^{\infty}\frac{(-1)^m}{m!}(2 \cdot gd_f \cdot r_f)^m\right),$$

that is $\overline{S21}_l S21_l \approx \overline{S21}S21 \cdot \exp(-2 \cdot gd_f \cdot r_f)$, which is the same as $$|S21_l|^2 \approx |S21|^2 \cdot \exp(-2 \cdot gd_f \cdot r_f) \quad (18)$$

Again, it can be seen that the gain of the filter network depends on the group delay.

Cascading the correction network and the filter network it is found from Equations 9 and 18 that the combined gain for the corrected network and the filter network is $$|S21_l|^2 |S11_l|^2 \approx |S21|^2 \cdot \exp(-2 \cdot (gd_c \cdot r_c + gd_f \cdot r_f)) \quad (19)$$

For perfect group delay equalisation we require:

$$gd_c(\omega)+gd_{fi}(\omega)=C \text{ for } -1\leq\omega\leq1 \quad (20)$$

where C is a constant.

For perfect gain we also require Equation 19 to be equal to a constant. It can be seen from Equation 19 that the passband is perfectly flat when $$gd_c(\omega)\cdot r_c+gd_f(\omega)\cdot r_f=K \text{ for } -1\leq\omega\leq1 \quad (21)$$

and K is a constant.

If the filter network and the correction network have very similar or the same Qs, $r_c=r_f$ and Equation 21 can be rewritten as follows:

$$gd_c(\omega)+gd_f(\omega)=K' \text{ for } -1\leq\omega\leq1 \quad (22)$$

For different Qs, we write $$gd_c(\omega)+\frac{r_c}{r_f}gd_f(\omega)=K'' \text{ for } -1\leq\omega\leq1 \quad (23)$$

In practice, the gain and group delay will not be exactly flat and it is acceptable if the gain and group delay across the passband is a ripple function. Consequently, equations 20, 22 and 23 can be written as $$gd_{c_l}(\omega)+gd_{f_l}(\omega)=f(\omega) \text{ for } -1\leq\omega\leq1 \quad (24)$$

$$gd_c(\omega)+gd_f(\omega)=g(\omega) \text{ for } -1\leq\omega\leq1 \quad (25)$$

$$gd_c(\omega)+\frac{r_c}{r_f}gd_f(\omega)=h(\omega) \text{ for } -1\leq\omega\leq1 \quad (26)$$

where $f(\omega)$, $g(\omega)$ and $h(\omega)$ are ripple functions. It is of course desired that the ripples are small to minimise the variation in gain and group delay and provide a gain and a group delay that is approximately uniform across the passband.

From Equation 7, it is known that $gd_{c_l}\approx gd_c$ and from Equation 15 it is known that $gd_{f_l}(\omega)$ equals $gd_f(\omega)$ plus some extra higher order terms in the Taylor series. Consequently, from Equations 24 and 25 it can be seen that if the filter and correction network have the same or substantially the same Q, the conditions for a flat group delay and passband are the same and when the passband is flat the group delay is also flat and vice versa, provided that the extra terms in the Taylor series are small enough. In reality, the extra terms are small but still significant and so there has to be a slight trade off between the group delay equalisation and amplitude equalisation.

If the filter network and the correction network have very similar but not exactly the same Qs, an acceptable approximation to group delay and gain flatness is still provided if the group delay of the filter network and the correction network exhibit the relationship of Equation 25.

Moreover, it has been found, that if the Qs are different, a polynomial for the correction network can still be found that satisfies both Equations 24 and 26. In more detail, it has been found that as long as $$0.4\leq\frac{r_c}{r_f}\leq2.5 \quad (27)$$

the group delay is approximately flat when the amplitude is approximately flat. In fact, it has been found that using a slightly lower Q for the correction network than for the filter network allows flattening of the passband for a greater percentage of the filter bandwidth for a given order of correction network. In other words, when extra loss is added to the correction network to give an $r_c$ that is higher than $r_f$, a greater percentage of the filter passband can be flattened for a given order of correction network. As a specific example, it has been found that a Q for the correction network that gives $r_c=2r_f$ is suitable for increasing the bandwidth over which the passband is flattened but also providing a substantially uniform group delay. In fact, as long as the Q of the correction network is selected such that $$1\leq\frac{r_c}{r_f}\leq2.5 \quad (28)$$

a satisfactorily uniform group delay may be obtained while, at the same time, the percentage of the bandwidth over which the passband is flattened is increased.

Figure 5:
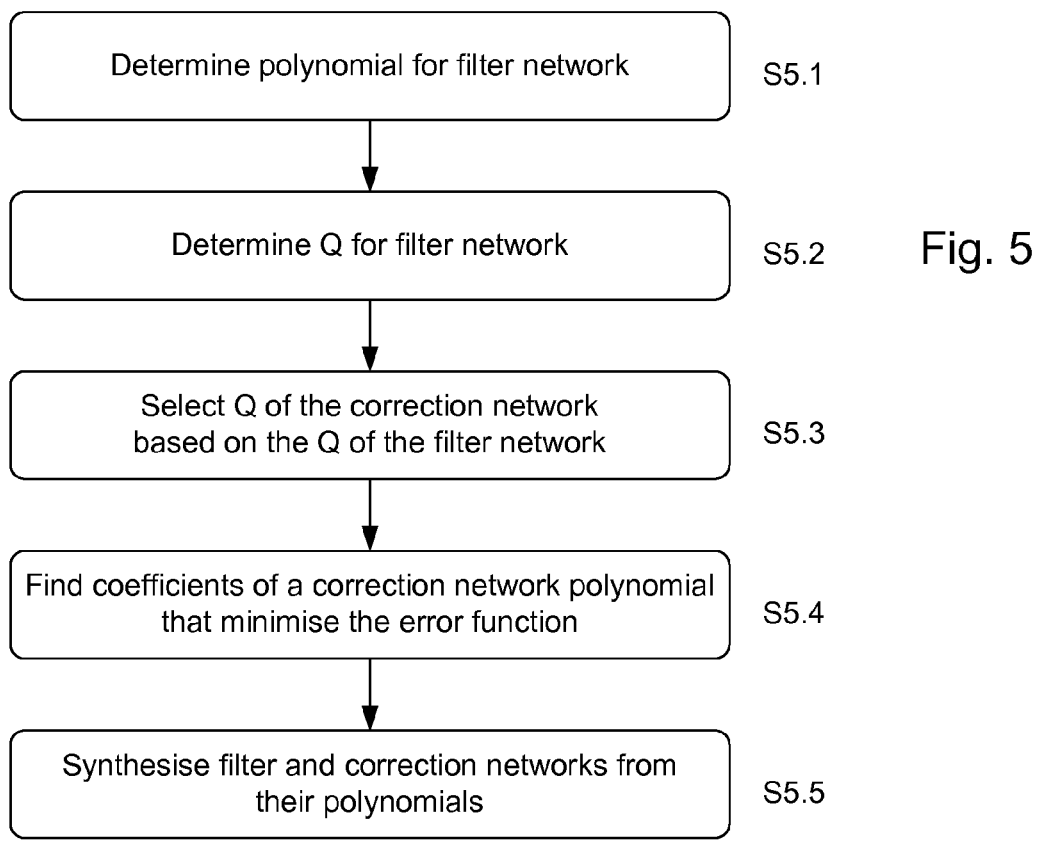
FIG. 5 illustrates a method for designing a correction network according to an aspect of the invention.

According to embodiments of the invention, the polynomial of the correction network is chosen to flatten the passband amplitude and the group delay for the selected Q factors. It will now be shown, with reference to FIG. 5, how an appropriate correction network polynomial that gives an approximately flat passband amplitude and group delay for the whole filter network arrangement can be found, according to the invention, and how a correction network can be synthesised based on the polynomial.

The polynomial for the desired filter network is first determined (step S5.1). The skilled person would know how to determine a polynomial for a given filter network and the process will not be described in detail herein. The Q of the filter network is then chosen at step S5.2. The Q of the filter network depends on the type of resonators of the filter network and the medium in which they are implemented. Choosing the Q of the filter network may involve determining the technology to use and then determining the resulting Q. Alternatively, choosing the Q of the filter network may involve selecting a desired Q and then determining the technology to be used to provide the selected Q.

An appropriate Q for the correction network is then determined based on the Q of the filter network (step S5.3). If the resonators of the correction network are selected to be of the same type as the resonators of the filter network and further selected to be implemented in the same medium, the Q of the correction network will be the same as the Q of the filter network. The Qs of the networks can also be chosen to be different. As will be described in more detail below, if the Qs of the correction network and the filter network are the same or substantially similar, the exact Q does not have to be known for the design and synthesis of the correction network and step S5.3 of choosing the Q of the correction network may involve choosing to make the Q of the correction network the same as the filter network. For example, choosing the Q of the correction network may involve choosing to manufacture the correction network and the filter network in the same material and with the same type of resonators. If different Qs are instead used for the filter network and the correction network, step S5.3 may instead involve choosing a specific value for the Q for the correction network. The value of the Q for the correction network may be chosen to be sufficiently close to the value of Q for the filter network to provide a value of $r_c$ that complies with Equation 28 or at least Equation 27.

A polynomial for representing the desired transfer function of the correction network then has to be determined. For example, a Generalised Reverse Coefficient Bessel Polynomial may be used as the starting point for finding a suitable polynomial H(s) for the correction network. The Generalised Reverse Coefficient Bessel Polynomial is a solution to the 2nd order differential equation:

$$s\theta_n'' - (2n - 2 + a + bs) \cdot \theta_n' + B \cdot n \cdot \theta_n = 0 \quad (29)$$

where a and b are complex values and n is a positive integer.

The solutions to Equation 29 are of the form:

$$\theta_n = \sum_{k=1}^{n} f_k \cdot s^{n-k} \quad (30)$$

where $$f_k = \frac{n!(n+k+a-2)^{(k)}}{k!(n-k)!b^k}$$

If a Bessel polynomial is used, it can be seen from Equation 30 that in the optimisation process to find the correction network polynomial, no matter what its order, there are only two variables, namely a, b. The insertion loss of the correction network, $|S11_l|^2 = F(\theta_n(a,b), Q)$, is a function of Q of the correction network and of $\theta_n$, and therefore of a and b.

Of course the order of the correction network has a bearing on the degree of equalisation achievable. Generally, a correction network of order equal to that of the filter network is sufficient. However a lower order network can be used with some compromise on the flatness of the gain and the group delay. A lower order correction network may be desirable in order to reduce the size of the overall filter network.

Once a suitable polynomial as a starting point for the correction network has been chosen, the coefficients of the polynomials need to be optimised (step S5.4). To find the coefficients of the final polynomial, an error function is first constructed.

A suitable error function for minimising the gain is given by $$E_1(\omega, \sigma_k, \omega_k) = ||S11_l(\omega, \sigma_k, \omega_k)|^2 \cdot |S21_l(\omega)|^2 - \max(|S11_l(\omega, \sigma_k, \omega_k)|^2 \cdot |S21_l(\omega)|^2)| \quad (31)$$

where $$|S11_l(\omega, \sigma_k, \omega_k)|^2 \cdot |S21_l(\omega)|^2 = \quad (32)$$

$$\frac{\prod_{k=1}^{K}((\sigma_k + r_c)^2 + (\omega - \omega_k)^2) \prod_{m=1}^{M}((\sigma_m - r_f)^2 + (\omega - \omega_m)^2)}{\prod_{k=1}^{K}((\sigma_k - r_c)^2 + (\omega - \omega_k)^2) \prod_{p=1}^{P}((\sigma_p - r_f)^2 + (\omega - \omega_p)^2)}$$

where $\sigma_k + i\omega_k$ are the roots of the polynomial for the correction network,
$\sigma_m + i\omega_m$ are the roots of the numerator polynomial for the filter network and
$\sigma_p + i\omega_p$ are the roots of the denominator polynomial for the filter network.

From Equations 7, 15 and 22, and assuming that the higher order terms in the Taylor expansion are zero such that $gd_{f_i}(\omega)$ equals $gd_f(\omega)$ in Equation 15, it is realised that the group delay is flattened when the gain is flattened as long as the Q factors for the filter network and the correction network are the same and Equation 31 would then be the only error function that needs to be minimised to flatten both the gain and the group delay. However, the higher order terms in the Taylor expansion are in fact not zero and slightly different Q factors may be appropriate and it may therefore also be desired to consider an error function for minimising the group delay.

A suitable error function for minimising the group delay is given by $$E_2(\sigma_k, \omega_k) = 2 \cdot \sum_{k=1}^{K} \frac{(\sigma_k - r_c) \cdot (\omega - \omega_k)}{((\sigma_k - r_c)^2 + (\omega - \omega_k)^2)^2} + \quad (33)$$

$$\sum_{p=1}^{P} \frac{(\sigma_p - r_f) \cdot (\omega - \omega_p)}{((\sigma_p - r_f)^2 + (\omega - \omega_p)^2)^2} - \sum_{q=1}^{Q} \frac{(\sigma_q - r_f) \cdot (\omega - \omega_q)}{((\sigma_q - r_f)^2 + (\omega - \omega_q)^2)^2}$$

It should be noted that the error function for the group delay is found by first differentiating Equation 20 with respect to ω, which gives $$gd_c'(\omega) + gd_{f_i}'(\omega) = 0 \text{ for } -1 \leq \omega \leq 1 \quad (34)$$

where $gd_c'(\omega)$ is the derivative of $gd_c(\omega)$ with respect to ω and $gd_{f_i}'(\omega)$ is the derivative of $gd_{f_i}(\omega)$ with respect to ω. In reality, the sum of the derivatives of the group delays of the correction network and the filter network will not be exactly zero but should be minimised to flatten the overall group delay of the filter network arrangement. The error function for the group delay can be found by differentiating expressions for group delay based on Equations 5 and 12 for a lossy network with respect to ω and replacing the derivatives of the group delay in Equation 34 with the differentiated expressions.

Equations 31 and 33 can be combined to give a combined error function:

$$E(\sigma_k, \omega_k) = \phi E_1(\sigma_k, \omega_k) + \gamma E_2(\sigma_k, \omega_k) \quad (35)$$

where φ,γ are weighting constants defining the importance of group delay or amplitude flatness. $E(\sigma_k, \omega_k)$ can be minimised for a number of points in the interval $-1 \leq \omega \leq 1$, using one or many appropriate optimisation techniques, to find the coefficients of the Generalized Reverse Coefficient Bessel Polynomial or other suitable polynomial chosen.

The relationships between the group delay and the gain shown above are not exact and it is has been found that sometimes it is better to flatten the amplitude and accept the group delay that follows. In other words, a polynomial may be chosen that only minimises the error function for the gain $E_1$. Having a nearly perfectly flat passband is sometimes more important than having a perfectly constant group delay. In some embodiments, the determination of the coefficients of the correction network polynomial can be considered to be carried out in two parts. First, equation 35 is minimised to find approximate coefficients. The roots of the correction polynomial are then optimised by minimising $E_1$ from Equation 31 only. For example, it is contemplated that when the Qs are the same or substantially the same, only the error function for the gain is minimised to find the coefficients of the polynomial since when the Qs are the same or similar the group delay is substantially flat when the gain is substantially flat. Only minimising the error function for the gain $E_1$ can be considered to correspond to minimising the error function E of Equation 35 but with a zero value assigned to the weighting coefficient γ for $E_2$. Moreover, it is contemplated that when the Qs are different, both the error functions for the gain and the group delay are minimised to find the coefficients of the polynomial. Values may be selected for the weighting constants of Equation 35 that give more weight to either the error function for the gain or the error function for the group delay.

Of course, both error functions may be considered even when the Qs are the same or similar.

Suitable values of a and b of the Generalised Reverse Coefficient Bessel Polynomial to minimise $E_1$ and/or a combination of $E_1$ and $E_2$ are determined using an appropriate optimisation technique. The error function may be minimised by an interactive process. It should be noted that, when the Qs are the same or substantially the same, the exact value of Q is not needed to find suitable values of a and b. A rough estimate of the Q is sufficient and the design will still be valid for a Q of, for example, half the design value. For a low Q filter, a fixed value of $r_c$ of 0.1 has been found suitable.

If different Qs are used, the bandwidth over which both the passband and the group delay are flat could be slightly increased. However, the precise values of Qs for both networks are then needed for the optimisation.

Accordingly, when the Qs are the same or substantially the same an estimate of $r_c$ and $r_f$ would be used in the error functions $E_1$ and $E_2$. When the Qs are different, more precise values of $r_c$ and $r_f$ would instead be used in the error functions $E_1$ and $E_2$.

When finding the coefficients of the polynomial to minimise the error function, the symmetry of the correction network polynomial is maintained about the line $s=r_c$. In other words, the coefficients are optimised to provide a correction network in which all resonators have the same Q. A property of this symmetry is that when the network is synthesised there will be a constant resistive residue associated with each resonator.

It will be appreciated that although one specific example of a gain error function and a group delay error function has been given above, alternative error functions can be constructed and the optimisation of the correction network is not limited to the use of the error functions described herein.

Moreover, although the polynomial has been described to be obtained from a Bessel polynomial as a starting point, it should be realised that other suitable polynomials can be used. The polynomial does not have to be a Bessel polynomial. If a Generalised Reverse Coefficient Bessel polynomial is used as a starting point, the final polynomial may not be a Bessel polynomial. In a first stage of the minimisation of the error function, the constraints that maintain the polynomial as a Bessel polynomial may be kept but in a second stage, when the error function is close to being minimised, the constraints are removed and the final polynomial for the correction network may therefore only be close to a Bessel polynomial.

The determined polynomials for the filter network and the correction network can then be used to synthesise the filter network and the correction networks (step S5.5). An example of how to synthesise a correction network from the lossless H(s) is described below. However, it should be realised that a lossy H(s) could also be used. A constant resistive element would be extracted with each resonator.

To start the network synthesis process, it can be considered that the admittance Y(s) for the one-port network is given by $$Y(s) = \frac{1 - S11(s)}{1 + S11(s)} \quad (36)$$

Equation 36 can be rewritten as $$Y(s) = \frac{\text{real}[H_o(s)] + \text{imaginary}[H_e(s)]}{\text{real}[H_e(s)] + \text{imaginary}[H_o(s)]} \quad (37)$$

where $H_o(s)$ is the odd part of H(s) and $H_e(s)$ is the even part of H(s).

For the special case of pole-zero complex conjugate symmetry this reduces to $$Y(s) = \frac{H_o(s)}{H_e(s)} \quad (38)$$

The synthesis of the one-port network can be performed by removing elements from the admittance function of Equations 37 or 38. When H(s) has complex conjugate symmetry, elements can be extracted from Equation 38 by continued fraction expansion. However, for the general case, H(s) has complex coefficients and elements must be extracted from the admittance function of Equation 37. It is then useful to consider that Equation 37 can be written as $$Y(s) = \frac{C(s)}{A(s)} \quad (39)$$

where A(s) and C(s) are chain matrix parameters.

Shunt capacitors and frequency invariant susceptances followed by unit inverters can then repeatedly be extracted by multiplying the chain matrix from the polynomials by that of the negative of the element to be extracted, to give a network with the topology of FIG. 6a, as will be described in more detail below. Equations for removing elements are provided as Equations 40 to 42 below.

For the removal of a capacitor $C_k$, the following equation can be used.

$$\begin{bmatrix} 1 & 0 \\ -sC_k & 1 \end{bmatrix} \cdot \begin{bmatrix} A(s) \\ C(s) \end{bmatrix} = \begin{bmatrix} A(s) \\ C(s) - s \cdot C_k \cdot A(s) \end{bmatrix} \text{ where} \quad (40)$$

$$C_k = \frac{C(s)}{sA(s)} \bigg|_{s \to \infty}$$

For the removal of a frequency invariant susceptance $b_k$, the following equation can be used.

$$\begin{bmatrix} 1 & 0 \\ -i \cdot b_k & 1 \end{bmatrix} \cdot \begin{bmatrix} A(s) \\ C(s) \end{bmatrix} = \begin{bmatrix} A(s) \\ C(s) - i \cdot b_k \cdot A(s) \end{bmatrix} \text{ where} \quad (41)$$

$$b_k = \frac{C(s)}{i \cdot A(s)} \bigg|_{s \to \infty}$$

For the removal of a unit admittance inverter, the following equation can be used $$\begin{bmatrix} 0 & i \\ i & 0 \end{bmatrix} \cdot \begin{bmatrix} A(s) \\ C(s) \end{bmatrix} = \begin{bmatrix} i \cdot C(s) \\ i \cdot A(s) \end{bmatrix} \quad (42)$$

Capacitor $C_k$ and frequency invariant susceptance $b_k$ pairs are removed separated by unit admittance inverters, as is known in the art. Each stage reduces the order of the polynomials A(s) and C(s) by 1.

Once the correction network has been synthesised, various network transformations are carried out to arrive at a network approximation of the correction network in the form it would be manufactured as would be well known by the person skilled in the art. The correction network can then be manufactured. It will be appreciated that the correction network and the filter network would be manufactured using the technology determined to provide the Qs determined at steps S5.2 and S5.3. If a similar or the same Q factor is required in the filter network and the correction network, the correction network can be manufactured in the same or in a similar medium to the filter.

An example of finding a suitable correction network for a specific filter and of incorporating the correction network into a filter network arrangement will now be described. As an example, a 4th order generalised Tchbeyshev filter with transmission zeros at −1.74i and 1.4i and poles (for a lossless filter) at −0.9640−0.6406i, −0.1589+1.1767i, −0.2419−1.2257i, −0.8810+0.7938i can be considered. The Q of the filter is approximately 100 with $r_f$=0.12.

The filter may be realised as a folded edge-coupled microstrip filter with centre frequency 1.345 GHz and bandwidth 110 MHz. A substrate with a relative permittivity $\xi_r$ of 9.8, and a thickness 0.635 mm was considered.

Using the above described method for finding the coefficients of the correction network polynomial, a 2nd order correction network polynomial can be obtained. The Q of the correction network is also chosen to be approximately 100 with $r_c$=0.12. The poles of the obtained suitable lossless polynomial are determined to be at −0.8582+0.4615i and −0.8856−0.5245i. The zeros would be at 0.8582+0.4615i and 0.8856−0.5245i. The lossy poles and zeros would of course be shifted to the left in the complex plane by $-r_c$.

The one-port correction network may be synthesised from the polynomial using the method described above. A prototype one-port network as shown in FIG. 6a was obtained, with values $C_1$=0.5734, $b_1$=0.0225, $C_2$=1.7385 and $b_2$=0.0413. The prototype network was then normalised, the shunt capacitors and frequency invariant susceptances were transformed to series half wavelength resonators and transformers were introduced into the inverters to scale the resonator admittance to unity, giving the network shown in FIG. 6b. For the network shown in FIG. 6b, $$J1 = \frac{1.3206}{\sqrt{Y}}, J2 = \frac{1.0015}{Y}$$

and $\lambda_o$ is the centre frequency of the filter network and the correction network and given a lower and upper band edge frequencies of 1.29 GHz and 1.40 GHz respectively we have for a 1 Ohm system Y=7.8056, $\phi_1$=π−0.005, $_2$=π−0.003, $J_1$=0.4727 and $J_2$=0.1283.

Figure 7B:
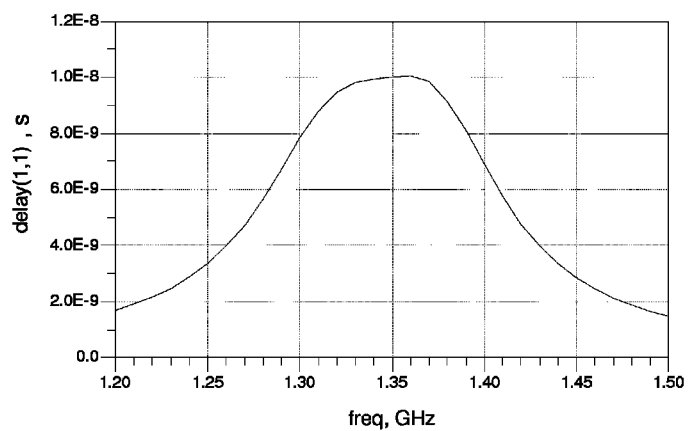

This network was then scaled to a 50 Ohm system and transformed to a coupled line microstrip circuit. The insertion loss and the group delay of the microstrip correction network obtained from an Agilent ADS circuit simulation are shown in FIGS. 7a and 7b respectively. The graph of FIG. 7a shows the gain of the correction network, in decibels, across the passband and the graph of FIG. 7b shows the group delay, in seconds, of the correction network across the passband.

Figure 8:
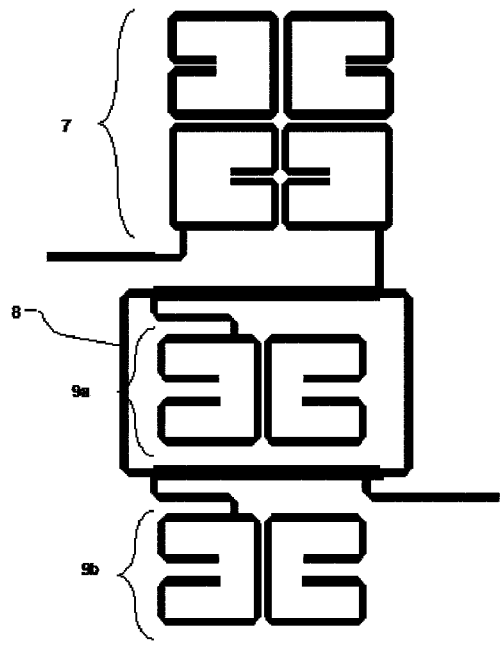
FIG. 8 illustrates a microstrip layout for one example of a filter network arrangement.

Two copies of the correction network were incorporated with a branch line coupler and the microstrip filter was added to this circuit to give a final circuit as shown in FIG. 8. The filter network 7, the coupler 8 and the correction networks 9a, 9b are indicated in the circuit of FIG. 8.

Figure 9A:
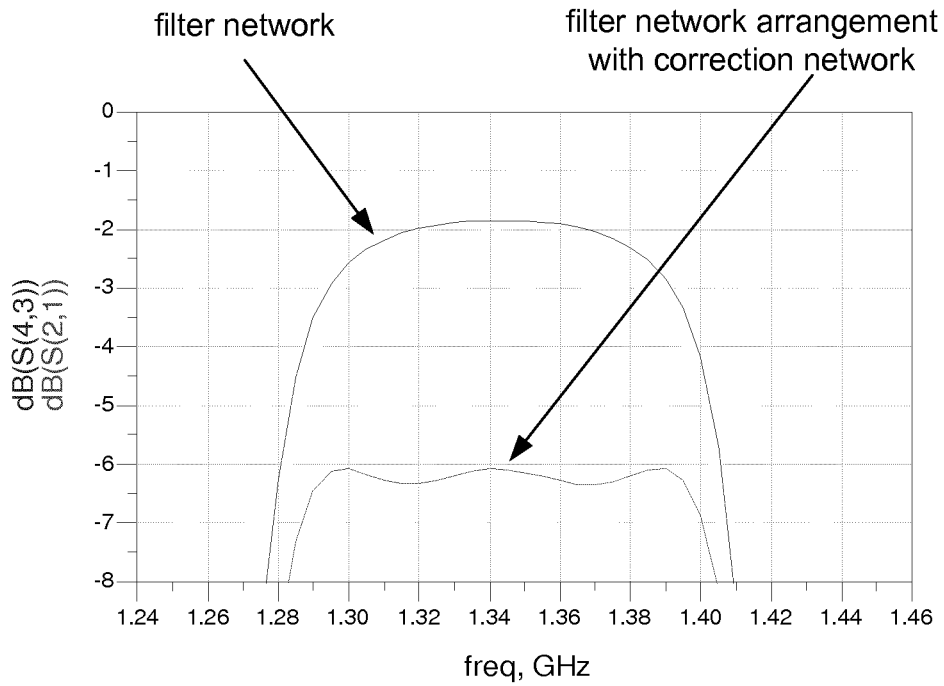
FIG. 9a and FIG. 9b illustrate the loss and group delay respectively of the complete circuit of FIG. 8 compared to the loss and group delay of the filter of the circuit on its own.
Figure 9B:
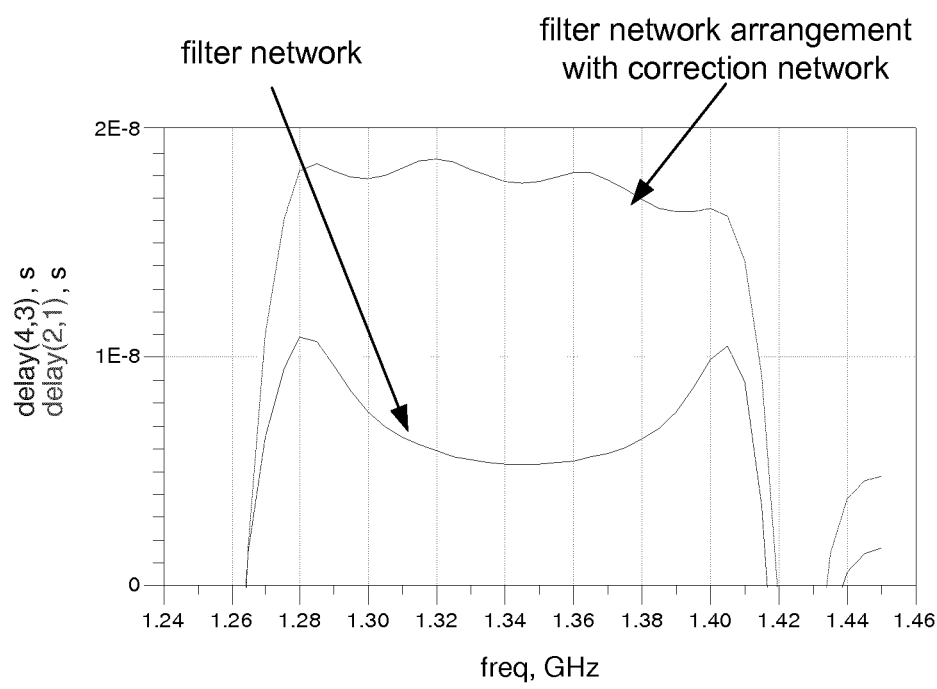

FIG. 9a shows the insertion loss of the final microstrip circuit compared to the insertion loss of the filter, obtained from an Agilent Momentum simulation. FIG. 9b shows the group delay of the final microstrip circuit compared to the group delay of the filter, obtained from an Agilent Momentum simulation. The gain is shown in decibels and the group delay is shown in seconds in the graphs. It is clear that both the gain and the group delay of the filter network arrangement comprising the correction network is flatter than the gain and the group delay of the filter network on its own. It can be seen from FIG. 9a that the variation in gain across the passband of the filter network arrangement is only approximately 30% of the variation in gain of the filter on its own. Correspondingly, it can be seen from FIG. 9b that the variation in group delay of the filter network arrangement is only approximately 40% of the variation in group delay of the filter on its own. The variation in gain and group delay can be reduced further by increasing the order of the correction networks. Consequently, the example of FIGS. 6a, 6b, 7a, 7b, 8, 9a and 9b show that a correction network can be provided, according to the invention, that flattens the attenuation and the group delay of a filter across the passband of the filter. Accordingly, the invention provides a filter network arrangement with improved group delay and gain characteristics compared to the filter network on its own.

It should be realised that the filter network and the correction networks discussed with respect to FIGS. 6a, 6b, 7a, 7b, 8, 9a and 9b are just one specific example and the correction network design technique, according to the invention, can be used to obtain a suitable correction network polynomial, and corresponding synthesised correction network, for compensating for the gain and group delay variation of any filter network.

Figure 10:
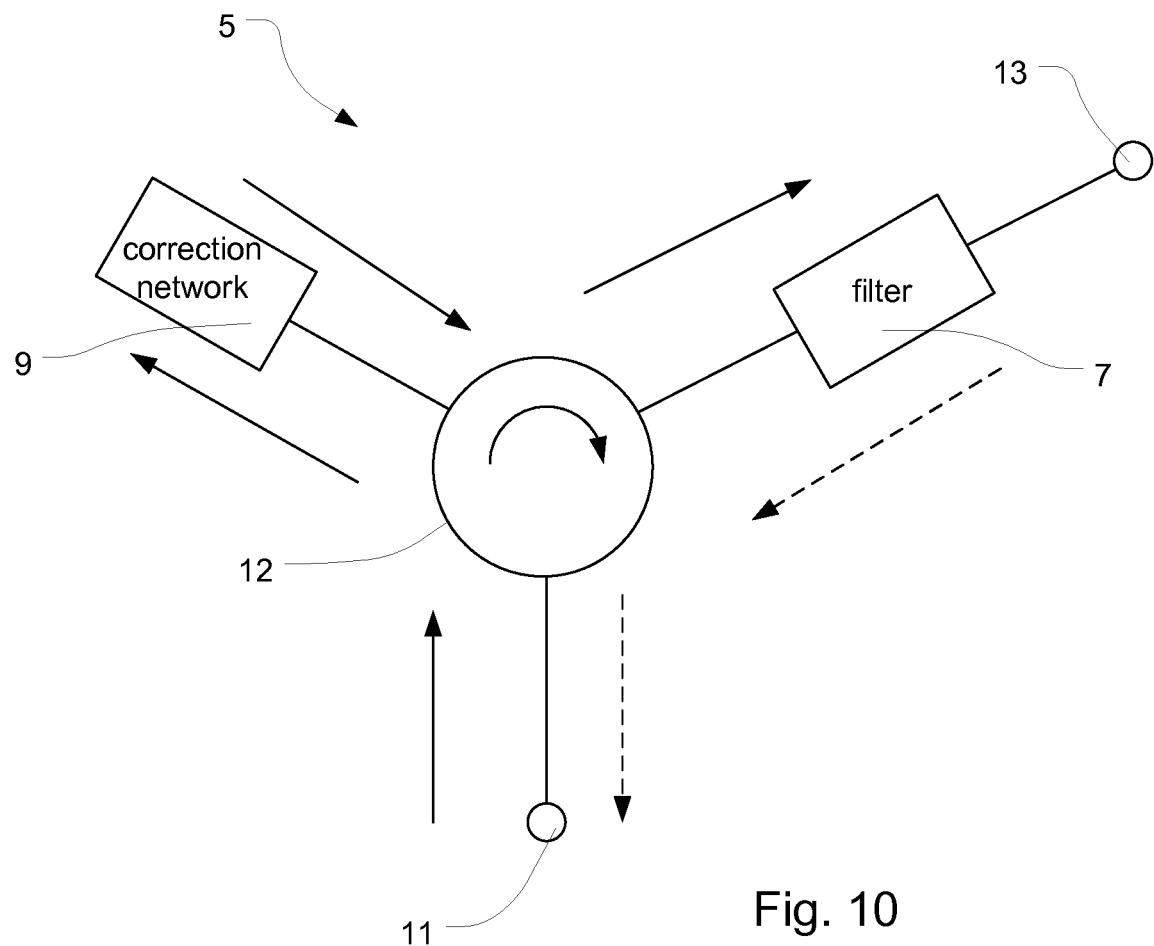
FIG. 10 is a schematic diagram of a filter network arrangement according to a second embodiment of the invention.

Another embodiment of the invention is shown in FIG. 10. Like reference numerals indicate like components. The filter network arrangement 5 of FIG. 10 comprises a first port 11, a circulator 12, an external correction network 9, a filter network 7, and a second port 13. Consequently, instead of the coupler, a circulator is used. The correction network 9 is identical to the correction networks 9a and 9b of FIG. 4, apart from that the correction network would have to be optimised to match the circulator instead of the couplers. As before, the filter network may be a microwave filter. The filter network may be implemented in ceramics. The path taken by a signal received at the first port 11 is shown by solid arrows. A signal received at the first port 11 is passed by the circulator 12 to the one-port correction network 9 and from there to the filter network 7 to be filtered and output at the second port 13. Consequently, the external network 9 will correct the group delay and gain of a signal entering at the first port 11 and leaving at the second port 13. The path taken by a signal received at the second port 13 is shown by dashed arrows. Due to the nature of the circulator 12, a signal received at the second port 13 is passed directly from the filter network 7 to the first port 11, by-passing the correction network 9.

Since a circulator is used instead of a coupler in the embodiment of FIG. 10, only a single correction network is required instead of two correction networks as shown in FIG. 4. However, for some frequencies 3 dB couplers can be made much smaller than circulators and consequently the filter network arrangement of FIG. 10 could be bigger and heavier than the filter network arrangement of FIG. 4.

It is contemplated that the filter network arrangements of FIGS. 4 and 10 may be implemented as low temperature co-fired ceramic (LTCC) filter network arrangements. To provide a small and compact structure, a filter network as shown in FIG. 4 may be provided as a multi-layer filter network arrangement. As a specific example, it may be a three layer LTCC structure with the filter network and the coupler on the middle layer and the correction networks on the top and bottom layer respectively.

Whilst specific examples of the invention have been described, the scope of the invention is defined by the appended claims and not limited to the examples. The invention could therefore be implemented in other ways, as would be appreciated by those skilled in the art.

For example, it should also be realised that although the correction network has been described in the two embodiments above as a one-port network, the correction network may be any suitable network. It may, for example, be a two-port network in which case no coupler or circulator would be needed. The described technique for synthesising the correction network would also be applicable for the two-port network. The polynomials discussed above give rise to a simple ladder one-port network. The equivalent two-port network would be more complex but could be used if appropriate for the application.

Moreover, although the filter network and the correction network have been described to be connected by a coupler or a circulator, it should be realised that if the correction network allows, for example if the correction network is a two-port network, the correction network may be directly connected to the filter network.

It should also be understood that although the embodiments have been described with respect to a microstrip or an LTCC network, any type of suitable integrated circuit can be used.

Additionally, it should be realised that the correction network can be used with any type of suitable filter for which it is desired to equalise the group delay and gain. The filter network arrangement does not have to be used in a communication satellite.

The invention claimed is:

1. An analogue filter network arrangement comprising:
a filter network; and
one or more correction networks, wherein the one or more correction networks is synthesized from a polynomial having coefficients selected to substantially equalize the passband gain and group delay of the filter network arrangement and wherein group delay is the derivative of phase with respect to angular frequency wherein the quality factors (Qs) of the filter network and the one or more correction networks are selected such that $$1 < \frac{r_c}{r_f} \le 2.5,$$

where $$r_c = \frac{f_0}{bw}\frac{1}{Q_c} \text{ and } r_f = \frac{f_0}{bw}\frac{1}{Q_f},$$

$Q_c$ is the Q of the one or more correction networks, $Q_f$ is the Q of the filter network and $f_0$ and bw are the centre frequency and the bandwidth of the filter network respectively.

2. The analogue filter network arrangement according to claim 1, wherein the one or more correction networks comprises one or more one-port networks.

3. The analogue filter network arrangement according to claim 2, wherein the one or more correction networks comprise two identical correction networks and the filter network arrangement comprises a coupler for connecting the correction networks and the filter network.

4. The analogue filter network arrangement according to claim 2, wherein the one or more correction networks comprises a single correction network and the filter network arrangement comprises a circulator for connecting the correction network to the filter network.

5. The analogue filter network arrangement according to claim 1, wherein the order of the one or more correction networks is the same or lower than the order of the filter network.

6. A low temperature co-fired ceramic (LTCC) structure comprising the analogue filter network arrangement according to claim 1.

7. A processing arrangement for a communication satellite comprising the analogue filter network arrangement according to claim 1.

8. A method of equalizing the gain and the group delay across the passband of an analogue filter network arrangement, the method comprising:
determining a polynomial and quality factor (Q) for a filter network;
choosing a Q for the one or more correction networks;
selecting a starting polynomial for the one or more correction networks and adjusting the coefficients of the polynomial to substantially equalize gain and group delay across the passband of the filter network, wherein the group delay is the derivative of phase with respect to angular frequency; and
synthesizing the filter network and the one or more correction networks from the polynomial for the filter network and the polynomial for the one or more correction networks, wherein the Qs of the filter network and the one or more correction networks are selected such that $$1 < \frac{r_c}{r_f} \le 2.5,$$

where $$r_c = \frac{f_0}{bw}\frac{1}{Q_c} \text{ and } r_f = \frac{f_0}{bw}\frac{1}{Q_f},$$

$Q_c$ is the Q of the one or more correction network, $Q_f$ is the Q of the filter network and $f_0$ and bw are the centre frequency and the bandwidth of the filter network respectively.

9. The method according to claim 8, wherein determining the coefficients of the polynomial comprises minimizing the error function $$E(\sigma_k,\omega_k)=\phi E_1(\sigma_k,\omega_k)+\gamma E_2(\sigma_k,\omega_k)$$

where $\phi, \gamma$ are weighting constants, $$E_1(\omega,\sigma_k,\omega_k)=||S11_f(\omega,\sigma_k,\omega_k)|^2\cdot|S21_f(\omega)|^2-\max(|S11_f(\omega,\sigma_k,\omega_k)|^2\cdot|S21_f(\omega)|^2)|$$

where $$|S11_l(\omega, \sigma_k, \omega_k)|^2 \cdot |S21_l(\omega)|^2 = \frac{\prod_{k=1}^{K}((\sigma_k + r_c)^2 + (\omega - \omega_k)^2)\prod_{m=1}^{M}((\sigma_m - r_f)^2 + (\omega - \omega_m)^2)}{\prod_{k=1}^{K}((\sigma_k - r_c)^2 + (\omega - \omega_k)^2)\prod_{p=1}^{P}((\sigma_p - r_f)^2 + (\omega - \omega_p)^2)}$$

and $$E_2(\sigma_k, \omega_k) = 2 \cdot \sum_{k=1}^{K} \frac{(\sigma_k - r_c) \cdot (\omega - \omega_k)}{((\sigma_k - r_c)^2 + (\omega - \omega_k)^2)^2} +$$

-continued $$\sum_{p=1}^{P} \frac{(\sigma_p - r_f) \cdot (\omega - \omega_p)}{((\sigma_p - r_f)^2 + (\omega - \omega_p)^2)^2} - \sum_{q=1}^{Q} \frac{(\sigma_q - r_f) \cdot (\omega - \omega_q)}{((\sigma_q - r_f)^2 + (\omega - \omega_q)^2)^2}$$

where $\sigma_k + i\omega_k$ are the roots of the polynomial for the correction network, $\sigma_m + i\omega_m$ are the roots of the numerator polynomial for the filter network and $\sigma_p + i\omega_p$ are the roots of the denominator polynomial for the filter network.

10. The method according to claim 9, wherein minimizing the error function comprises first minimizing $E(\sigma_k, \omega_k)$ to find approximate coefficients for the correction network polynomial and then minimizing $E_1$ on its own to optimize the roots of the correction network polynomial.

11. A processing arrangement for a communication satellite comprising the LTCC structure according to claim 6.

\* \* \* \* \*